United States Patent

Kim

[11] Patent Number: 5,990,492
[45] Date of Patent: Nov. 23, 1999

[54] SELF-ALIGNED THIN-FILM TRANSISTOR FOR A LIQUID CRYSTAL DISPLAY HAVING SOURCE AND DRAIN ELECTRODES OF DIFFERENT MATERIAL

[75] Inventor: Dong-Kyu Kim, Suwon, Rep. of Korea

[73] Assignee: Samsung Electronics Co., Ltd., Kyungki-do, Rep. of Korea

[21] Appl. No.: 08/879,964

[22] Filed: Jun. 20, 1997

Related U.S. Application Data

[62] Division of application No. 08/454,027, May 30, 1995, Pat. No. 5,674,757.

[51] Int. Cl.⁶ .................................................. G02F 1/13
[52] U.S. Cl. .............................. 257/59; 257/72; 257/388; 257/459; 257/347; 349/39; 349/46; 349/49
[58] Field of Search .............................. 257/59, 72, 388, 257/459, 347; 349/39, 43, 49

[56] References Cited

U.S. PATENT DOCUMENTS

| | | | |
|---|---|---|---|
| 4,770,498 | 9/1988 | Aoki et al. ................................. | 257/59 |
| 4,958,205 | 9/1990 | Takeda . | |
| 5,075,237 | 12/1991 | Wu ............................................. | 437/40 |
| 5,091,337 | 2/1992 | Watanabe .................................. | 437/41 |
| 5,326,712 | 7/1994 | Bae ........................................... | 438/239 |
| 5,595,620 | 1/1997 | Takei ......................................... | 349/93 |
| 5,633,738 | 5/1997 | Wakui et al. .............................. | 349/46 |
| 5,686,977 | 11/1997 | Kim et al. ................................. | 349/143 |

FOREIGN PATENT DOCUMENTS 404174563  6/1992  Japan ........................................ 257/59

*Primary Examiner*—Fetsum Abraham
*Attorney, Agent, or Firm*—Pillsbury Madison & Sutro

[57] ABSTRACT

A self-aligned thin-film transistor, fabricated by depositing a conductive layer on a transparent insulating substrate, etching the conductive layer so as to form a gate electrode together with gate lines, forming a triple layer having of a gate insulating layer, a semiconductor layer and an extrinsic semiconductor layer sequentially deposited over the substrate, etching the triple layer so that only a part thereof covering the gate electrode only remains to form an active pattern, depositing a transparent conductive layer over the substrate to form a drain electrode part by etching the transparent conductive layer so that a part of the transparent conductive layer remains overlapping the gate electrode, depositing a negative photoresist over the substrate, exposing the negative photoresist to a light supplied from the back of the transparent substrate opposite the gate and developing the thus-exposed photoresist, forming a drain electrode by removing the part of a transparent conductive layer appearing in a region over the gate wherefrom the photoresist is removed, depositing a conductive layer over the substrate to form a source electrode together with data lines by etching the conductive layer so that there remains a portion of the conductive layer opposite to the drain electrode with respect to the gate electrode, and removing a portion of the extrinsic semiconductor layer exposed over the gate electrode so as to form a channel.

10 Claims, 6 Drawing Sheets

SELF-ALIGNED THIN-FILM TRANSISTOR FOR A LIQUID CRYSTAL DISPLAY HAVING SOURCE AND DRAIN ELECTRODES OF DIFFERENT MATERIAL

This application is a division of application Ser. No. 08/454,027 filed May 30, 1995 now U.S. Pat. No. 5,674,757.

TECHNICAL BACKGROUND

The present invention concerns a self-aligned thin-film transistor (TFT) for a liquid crystal display (LCD) and a process for fabricating it, wherein the drain electrode and/or the source electrode is aligned with the gate electrode.

Generally, amorphous silicon TFT should have a high field effect current mobility and parasitic capacitances which are as low as possible, in order to be used for an active matrix liquid crystal display (AM-LCD). The field effect current mobility of a conventional amorphous silicon TFT is about 0.3 to 1.0 cm$^2$/V$_s$, which is too small to design a large scale AM-LCD of high pixel density. If the channel width is increased to obtain a sufficient current, the area of the TFT is increased, so that the opening ratio for transmitting light through the LCD pixels is reduced.

Referring to FIGS. 1A and 1B, respectively illustrating cross-sectional views of a conventional channel-etch and etch-stopper TFT, parasitic capacitance will now be specifically described.

Deposited over a substrate 1 are a gate electrode 2, gate insulating layer 3, amorphous silicon semiconductor layer 4, channel protecting layer or etch stopper 5, contact layer 6, source electrode 7, and drain electrode 8. Generally the gate electrode 4 is overlapped by the source and drain electrodes to some extent. The overlapped length is indicated by ΔL in FIGS. 1A and 1B of the drawings. This overlap causes, compared to an ordinary MOSFET, the TFT to produce considerable parasitic capacitances C$_{gd}$ (between gate and drain electrodes) and C$_{gs}$ (between gate and source electrodes). The C$_{gd}$ causes the voltage drop of the pixels as the gate voltage drops from a high state to a low state. This voltage drop is called the offset voltage or kick-back, and is approximately expressed by the following equation:

$$\Delta V_p = \frac{C_{gd}}{C_{gd} + C_{ls} + C_s} \Delta V_g$$

When driving the liquid crystal by alternating current, the voltage applied to the pixels is reversed around the common voltage V$_{com}$ at every frame and in this case, the common voltage V$_{com}$ is lowered by the offset voltage ΔV$_p$ so as to maintain a balance between the main frame and the sub-frame.

However, the liquid crystal capacitance C$_s$ is a function of the voltage, and therefore the balance is not precisely kept in the gray mode to produce a direct current thus resulting in flickering or persistence of images. Moreover, in order to reduce the difference of the offset voltages between gray modes and the absolute value of the offset voltage, the source capacitance C$_s$ is increased, which increases the opening ratio and the size of the TFT. To obviate this problem, conventionally there is provided an etch stopper TFT of half or wholly self-aligned type, as respectively shown in FIGS. 1C and 1D.

SUMMARY OF THE INVENTION

The object of the present invention is to provide a self-aligned TFT with reduced parasitic capacitances between the gate electrode and drain and source electrode.

According to an embodiment of the present invention, there is provided a process for fabricating a self-aligned thin-film transistor comprising the steps of:

depositing a conductive layer on a transparent insulating substrate;

etching the conductive layer so as to form a gate electrode together with gate lines;

forming a triple layer consisting of a gate insulating layer, a semiconductor layer and an extrinsic semiconductor layer sequentially deposited over the substrate;

etching the triple layer so that only a part covering the gate electrode remains, to form an active pattern;

depositing a transparent conductive layer over the substrate to form a drain electrode part by etching the transparent conductive layer so that a part of the transparent conductive layer remains overlapping the gate electrode;

depositing a negative photoresist over the substrate;

exposing the negative photoresist to a light supplied from the back of the transparent substrate opposite the gate and developing the thereby exposed photoresist;

forming a drain electrode by removing a part of the transparent conductive layer appearing in a region over the gate from which the photoresist is removed;

depositing a conductive layer over the substrate to form a source electrode together with data lines by etching the conductive layer so that there remains a portion of the conductive layer opposite to the drain electrode with respect to the gate electrode; and removing a portion of the extrinsic semiconductor layer exposed over the gate electrode so as to form a channel.

The gate electrode and gate lines may be made of aluminum and, in this case, the gate electrode is subjected to anodic oxidation. The amount of the drain electrode overlapping the gate electrode is determined, as required, by controlling the time of exposure to the light. The conductive layer deposited for the source electrode may be a transparent material and, in this case, the source electrode is aligned with the gate electrode as the drain electrode. Of course, the source electrode is formed simultaneously with the drain electrode. In order to secure the reliability of the TFT when it is used in an LCD, the gate insulating layer over the connecting pad for connecting the liquid crystal panel with the drive integrated circuit is etched before depositing the transparent conductive material, which is then deposited over the connecting pad. Thus, if the substrate deposited with the negative photoresist is exposed to the light supplied from the back of the substrate, the transparent conductive material remains over the connecting pad.

According to another embodiment of the present invention, a self-aligned TFT comprises:

a transparent insulating substrate;

a gate electrode and gate lines formed by etching a conductive layer deposited on a transparent insulating substrate;

a gate insulating layer deposited over the substrate with the gate electrode and gate lines;

a semiconductor layer deposited over the substrate so as to cover the gate electrode;

an extrinsic semiconductor layer deposited over the semiconductor layer so as to not cover a part of the semiconductor layer located directly over the gate electrode;

a drain electrode formed of a transparent conductive material so as to cover a part of the extrinsic semiconductor layer and a part of the gate insulating layer; and a source electrode and data lines formed of a conductive material so as to cover a part of the extrinsic semiconductor layer and a part of the gate insulating layer and to face toward the drain electrode.

The gate electrode and gate lines are preferably provided as a thin-film transparent conductive layer formed of aluminum, tantalum, chromium or titanium. In the case of aluminum, the gate electrode is subjected to anodic oxidation. Further, the gate insulating layer is preferably formed of silicon nitride or silicon oxide. Preferably, the semiconductor layer is formed of amorphous silicon and the extrinsic semiconductor layer of amorphous silicon doped with $n^+$. The source electrode and data lines may be formed of a transparent conductive material. When used in an LCD, the gate electrode and gate lines are preferably formed of aluminum and the connecting pad for connecting the liquid crystal panel with the drive integrated circuit is preferably formed of chromium.

The present invention will now be described more specifically with reference to the attached drawings, only by way of example.

BRIEF DESCRIPTION OF THE DRAWINGS

FIGS. 2A to 2E and 3A–3E illustrate, respectively in plan and in cross section, the steps of fabricating a self-aligned TFT together with the mask patterns according to an embodiment of the present invention.

DETAILED DESCRIPTION OF THE PREFERRED EMBODIMENT

Figure 1A:
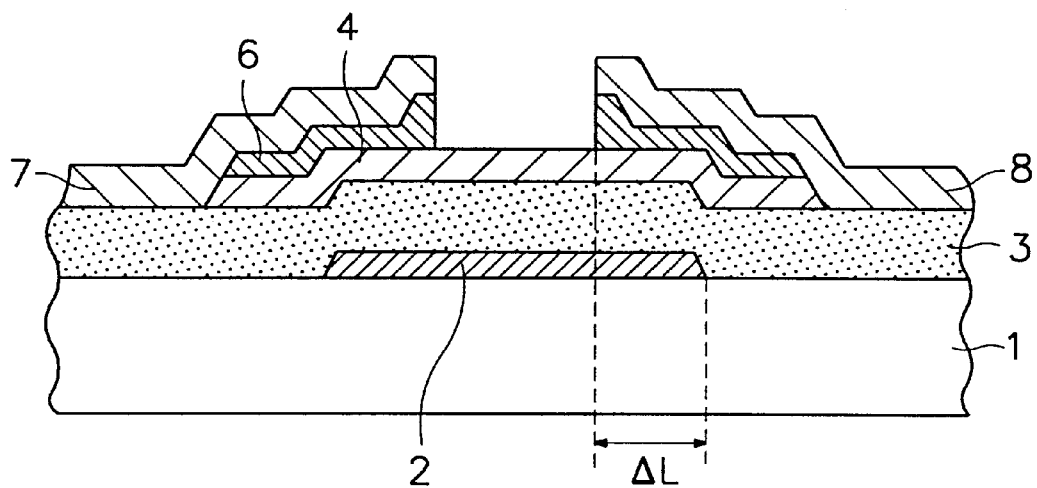
FIG. 1A is a cross sectional view of a conventional channel etch TFT.
Figure 1B:
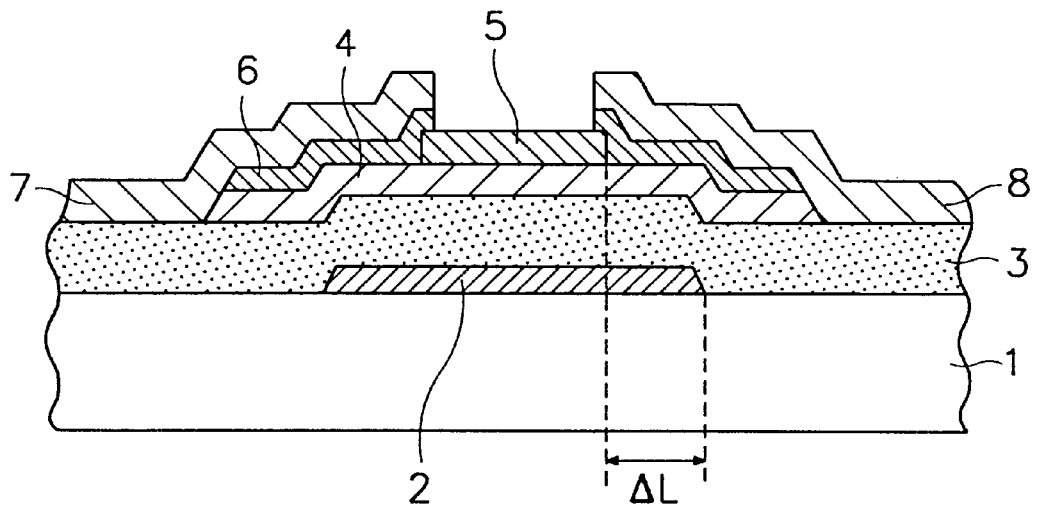
FIG. 1B is a cross sectional view of a conventional etch stopper TFT.
Figure 1C:
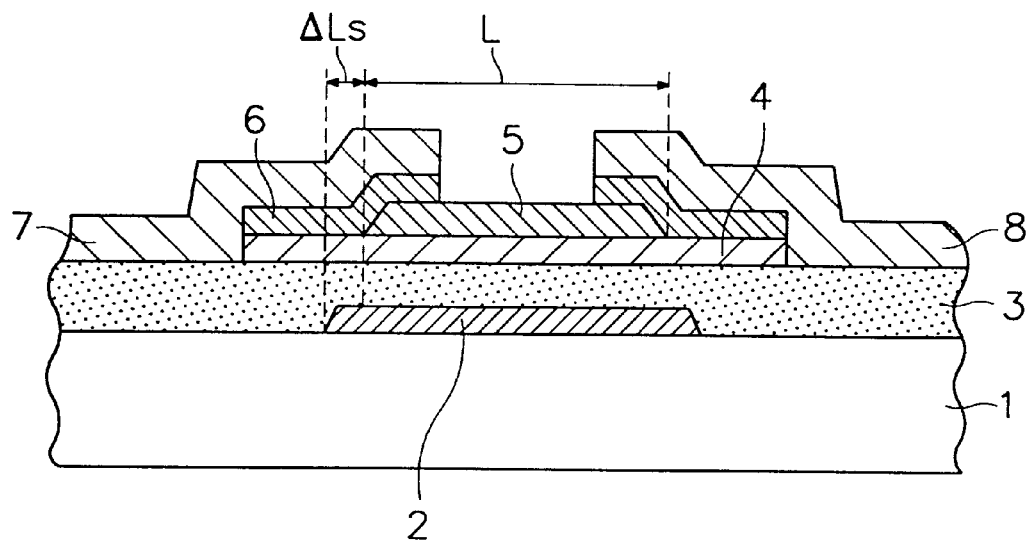
FIG. 1C is a cross sectional view of a conventional etch stopper TFT of a half self-aligned type.
Figure 1D:
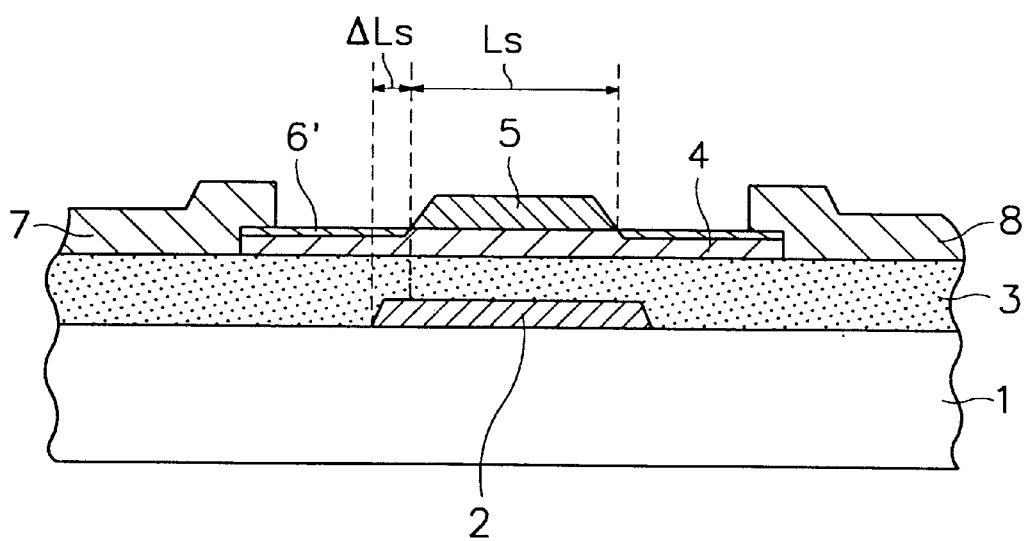
FIG. 1D is a cross sectional view of a conventional etch stopper TFT of a wholly self-aligned type.
Figure 2A:
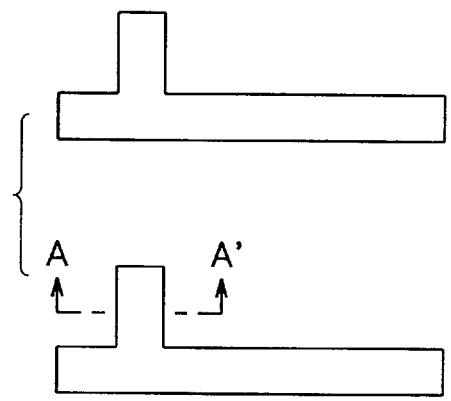
Figure 2B:
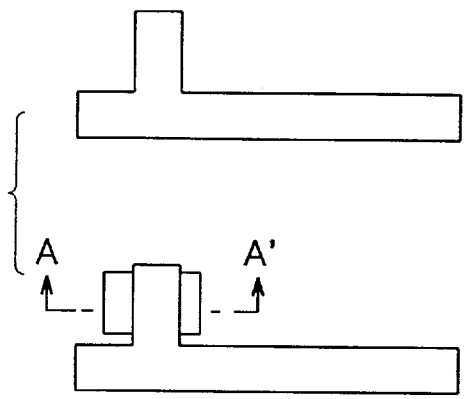
Figure 2C:
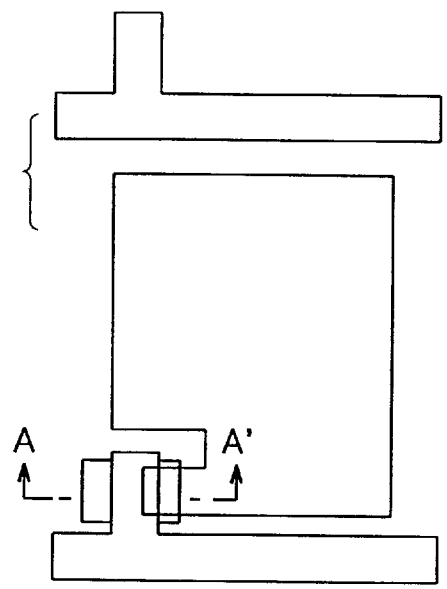
Figure 2D:
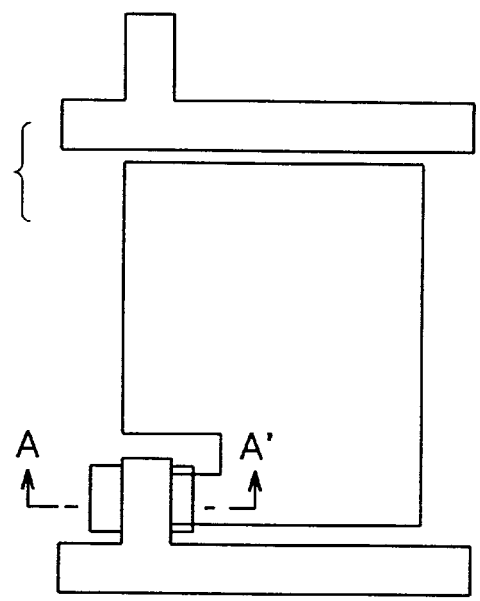
Figure 2E:
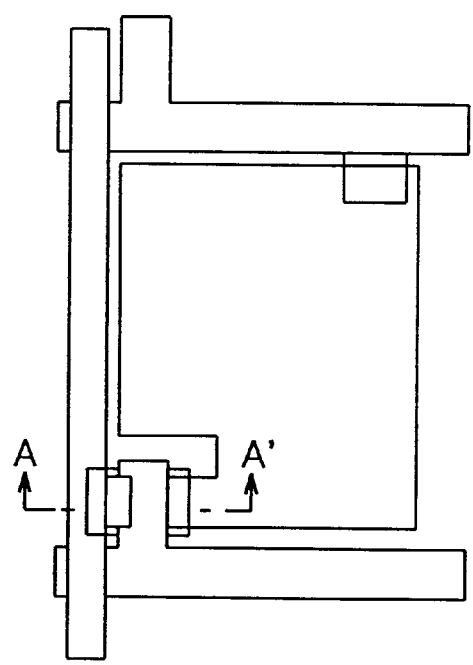
Figure 3A:
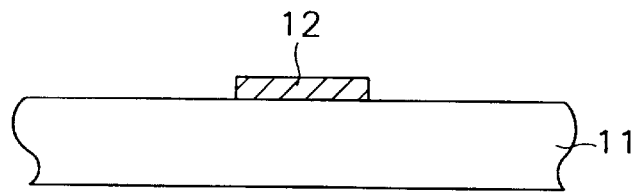
Figure 3B:
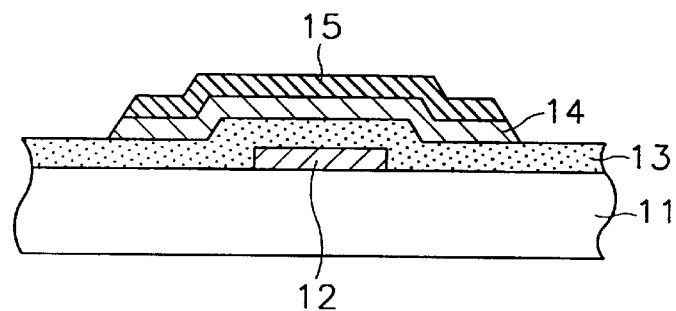
Figure 3B:
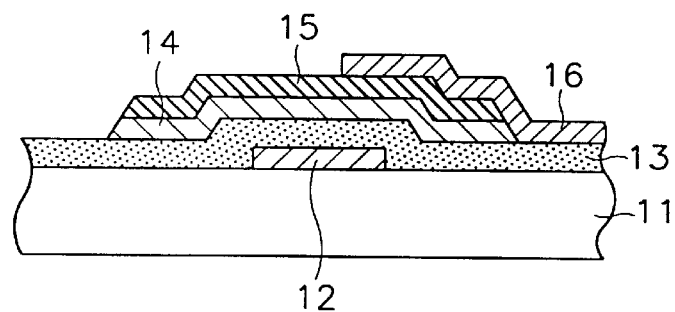
Figure 3B:
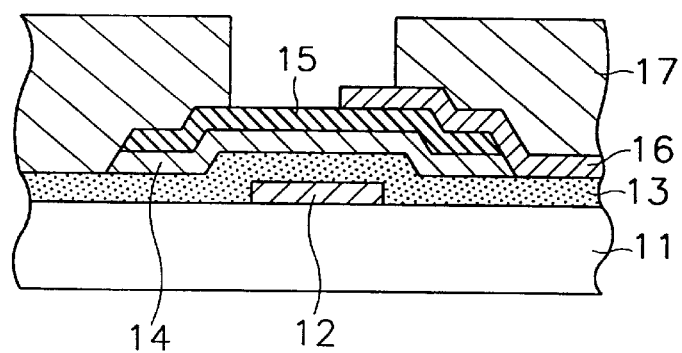

FIGS. 2A to 2E and 3A to 3E, respectively illustrate he mask patterns, of successive stages in manufacture of a self-aligned TFT embodying principles of the present invention and cross sections taken along lines 3A—3A, 3B—3B, 3C—3C, 3D—3D and 3E—3E. As shown in FIGS. 2A and 3A, a conductive material is deposited on a transparent substrate 11 and etched to form a gate electrode 12 and gate lines. The gate electrode is an opaque thin film with a thickness of 1,000 Å to 5,000 Å formed of aluminum, tantalum, chromium or titanium. Then, sequentially deposited over the substrate are a gate insulating layer 13, a semiconductor layer 14 and a extrinsic semiconductor layer 15 using the process of chemical vapour deposition (CVD). The extrinsic semiconductor 15 and semiconductor layer 14 are etched to form an active pattern while maintaining the part over the electrode 12. Generally, the gate insulating layer 13 is a thin film with a thickness of 1,000 Å to 5,000 Å, formed of silicon nitride (SiNx) or silicon oxide (SiOx). The semiconductor layer 14 is a thin film with a thickness of 500 Å to 2000 Å, formed of amorphous silicon. The extrinsic semiconductor layer 15 is a thin film with a thickness of about 500 Å, formed of amorphous silicon doped with $n^+$.

Then, as shown in FIGS. 2C and 3C-a, a transparent conductive layer such as ITO is deposited to have a thickness of about 500 Å and etched to form a drain electrode part 16 overlapping the gate electrode 12. A negative photoresist 17 is deposited over the substrate, which is then exposed to the light supplied from the back of the substrate opposite to the position of the gate electrode 12, as shown in FIG. 3Cb. In this case, the gate electrode 12 serves as a mask for aligning the gate electrode with the drain electrode. Developed, there is removed the portion of the photoresist directly over the gate electrode. The amount of the drain electrode overlapping the gate electrode is determined, as required, by controlling the time of exposure to the light.

Figure 3D:
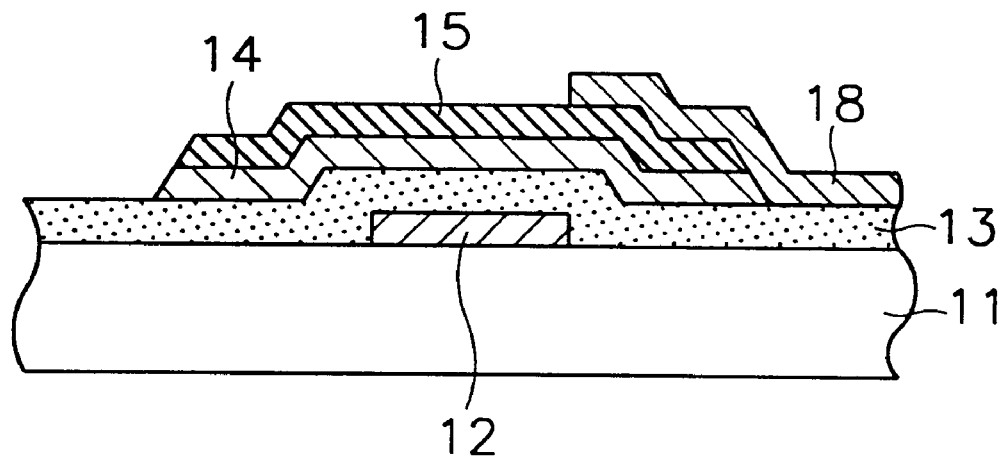
Figure 3E:
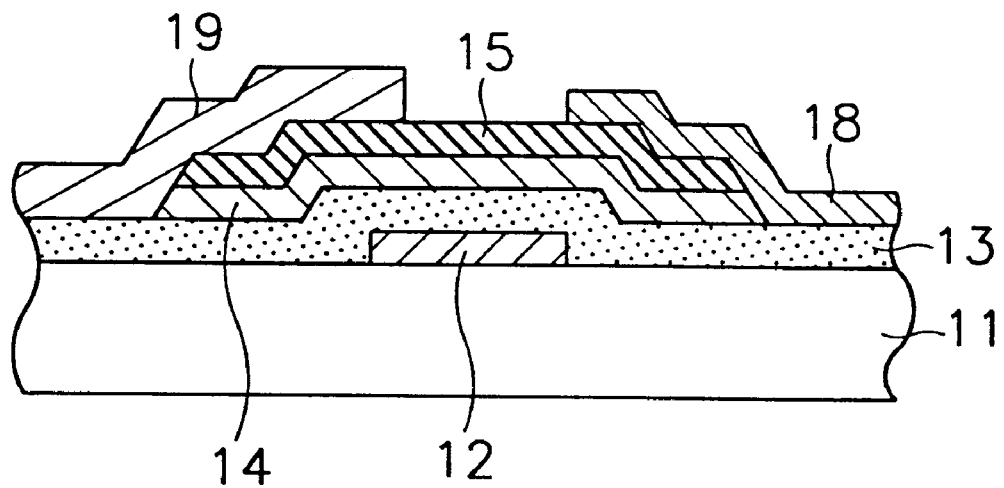

Then, as shown in FIGS. 2D and 3D, the exposed portion of the drain electrode part 16 is etched away to complete the drain electrode and the remaining photoresist 17 is removed. A source electrode 19 and data lines are formed opposite to the drain electrode 18 with respect to the gate electrode 12 by patterning a conductive material deposited over the substrate, as shown in FIGS. 2E and 3E. The conductive material may be transparent, and, in this case, the source electrode may be aligned with the gate electrode as the drain electrode. Namely, a transparent conductive layer such as ITO is deposited and etched to form a source electrode part overlapping the gate electrode 12. A negative photoresist is deposited over the substrate, which is then exposed to the light supplied from the back of the substrate opposite to the position of the gate electrode 12. In this case, the gate electrode 12 serves as a mask for aligning the gate electrode with the source electrode. Developed, there is removed the portion of the photoresist directly over the gate electrode. The amount of the source electrode overlapping the gate electrode is determined, as required, by controlling the time of exposure to the light. The portion exposed of the source electrode part 16 is etched away to complete the source electrode 19, and the remaining photoresist 17 is removed. Of course, the source electrode may be formed simultaneously with the drain electrode. As shown by the hatched portion 20 in FIG. 2E, a supplementary capacitance Cs may be formed simultaneously with the source electrode and data lines. The extrinsic semiconductor in the channel region is etched by using a conventional process such as dry etching.

What is claimed is:

1. A self-aligned thin-film transistor comprising:
   a transparent insulating substrate;
   a gate electrode formed on said substrate;
   a gate insulating layer formed over said gate electrode;
   a semiconductor layer formed on a portion of said gate insulating layer over said gate electrode;
   an extrinsic semiconductor layer formed over said semiconductor layer, said extrinsic semiconductor layer having first and second portions which are separated from each other with respect to said gate electrode;
   a drain electrode disposed on said first portion of the extrinsic semiconductor layer, said drain electrode being formed of a transparent conductive material and having an edge which is aligned with an edge of said gate electrode; and
   a source electrode disposed on said second portion of the extrinsic semiconductor layer, said source electrode being formed of a conductive layer different from said drain electrode.

2. The thin-film transistor as defined in claim 1, wherein said gate electrode is made of an opaque conductive layer.

3. The thin-film transistor as defined in claim 2, wherein said gate electrode is made of aluminum, tantalum, chromium or titanium.

4. The thin-film transistor as defined in claim 3, wherein said gate electrode is made of aluminum and said gate electrode is anodically oxidized.

5. A self-aligned thin-film transistor as defined in claim 1, wherein said gate insulating layer is formed of silicon nitride or silicon oxide.

6. A self-aligned thin-film transistor as defined in claim 1, wherein said semiconductor layer is formed of amorphous silicon and said extrinsic semiconductor layer is formed of amorphous silicon doped with n$^+$.

7. The thin-film transistor as defined in claim 1, wherein said source electrode is formed of a transparent conductive layer.

8. A self-aligned thin-film transistor comprising:

a transparent insulating substrate;

a gate electrode formed on said substrate;

a gate oxide film formed on said gate electrode by subjecting said gate electrode to anodic oxidation;

a gate insulating layer formed over said gate electrode;

a semiconductor layer formed on a portion of said gate insulating layer over said gate electrode;

an extrinsic semiconductor layer formed over said semiconductor layer, said extrinsic semiconductor layer having first and second portions which are separated from each other with respect to said gate electrode;

a drain electrode disposed on said first portion of the extrinsic semiconductor layer, said drain electrode being formed of a transparent conductive material and having an edge which is aligned with an edge of said gate electrode;

a source electrode disposed on said second portion of the extrinsic semiconductor layer, said source electrode being formed of a conductive laver different from said drain electrode, a connecting pad connected with said gate electrode by means of chromium lines and;

a drive integrated circuit connected with said connecting pad.

9. The thin film transistor as defined in claim 1, wherein the electrode does not overlap the gate electrode.

10. The thin film transistor as defined in claim 9, wherein the electrode does not overlap the gate electrode.

* * * * *